United States Patent [19]

Welles, II

[11] 4,392,068

[45] Jul. 5, 1983

[54] CAPACITIVE COMMUTATING FILTER

[75] Inventor: Kenneth B. Welles, II, Schenectady, N.Y.

[73] Assignee: General Electric Company, Schenectady, N.Y.

[21] Appl. No.: 284,157

[22] Filed: Jul. 17, 1981

[51] Int. Cl.³ .................... H03K 5/24; H03K 5/26; H03D 13/00

[52] U.S. Cl. .................... 307/522; 307/520; 328/167; 328/138; 333/172

[58] Field of Search .................... 328/167, 138; 307/520, 307/522; 333/172

[56] References Cited

U.S. PATENT DOCUMENTS

| | | | |
|---|---|---|---|
| 2,752,491 | 6/1956 | Rigoen | 250/27 |
| 3,559,081 | 1/1971 | Baudino et al. | 328/167 |
| 3,603,898 | 9/1971 | Dawson et al. | 333/70 A |
| 3,604,947 | 9/1971 | Puthuff | 328/167 |
| 3,761,740 | 9/1973 | Naive | |
| 3,801,918 | 4/1974 | Milne et al. | 329/104 |
| 4,010,459 | 3/1977 | Pontoppidan et al. | 340/258 A |
| 4,151,474 | 4/1979 | Woollvin et al. | 328/167 |
| 4,218,665 | 8/1980 | Fujisaki | 333/165 |
| 4,358,737 | 11/1982 | Bennett | 328/138 |

*Primary Examiner*—John S. Heyman
*Attorney, Agent, or Firm*—Geoffrey H. Krauss; James C. Davis, Jr.; Marvin Snyder

[57] ABSTRACT

A capacitive commutating filter provides a D. C. output voltage of amplitude responsive to the amplitude of an input waveform having a frequency substantially equal to the operating frequency of the filter. The filter operating frequency is established by a digital signal. The filter input is selectively and cyclically connected through N input resistances, wherein N is an integer greater than zero, to adjacently progressive N ones of $(2N+1)$ nodes, each having one of $(2N+1)$ capacitive filter elements connected to ground potential. The equilibrium voltages across the capacitive filter elements, established during the $N/(2N+1)$ segments of the input waveform during which each capacitor is connected to the input, are coupled to one set each of maximum-positive-polarity and maximum-negative-polarity diodes, for placing the maximum and minimum filter capacitive element voltages at respective ones of the inverting and non-inverting inputs of a differential amplifier, having the output thereof forming the filter output.

10 Claims, 3 Drawing Figures

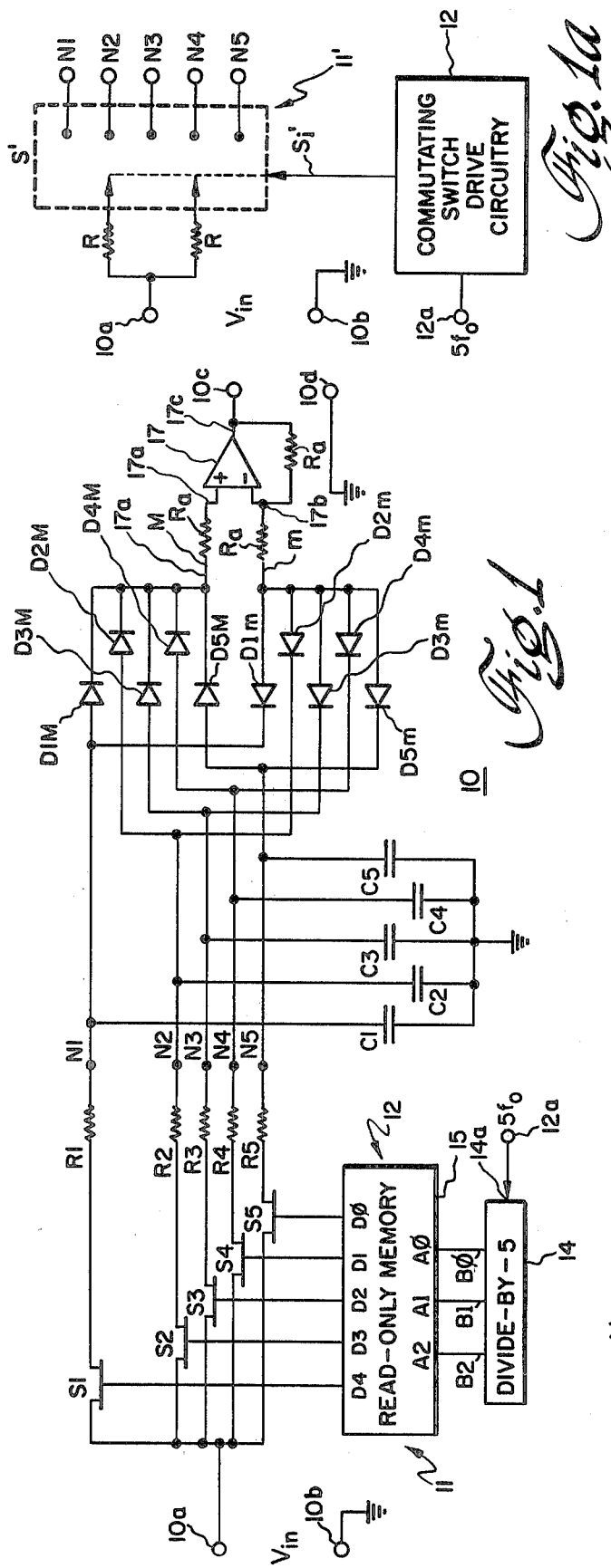

CAPACITIVE COMMUTATING FILTER

BACKGROUND OF THE INVENTION

The present invention relates to electronic waveform filtering circuitry and, more particularly, to a novel capacitive commutating filter for detecting a particular waveform frequency in an input signal.

Many data processing applications require a filter for detecting the presence of a waveform at a particular frequency. Many forms of capacitive commutating filter are known for providing this frequency detection function. The prior art filters utilized passive or active circuits in which the filter frequency is fixedly established and is dependent upon the ratio of values of various resistive, capacitive and/or inductive components. Such component values must be established with relatively narrow tolerance and cause the filter to not only be relatively expensive to fabricate, but also restrict operation to only a single frequency. It is highly desirable to have a capacitive commutating filter which has a filter frequency capable of being precisely and repeatedly controlled by an external signal, and particularly one of digital nature. It is also advantageous to provide a capacitive commutating filter in which the filter frequency is relatively independent of process variation or temperature drift of the electronic components utilized in the circuit.

BRIEF SUMMARY OF THE INVENTION

In accordance with the invention, my novel capacitive commutating filter, capable of being digitally controlled to a center frequency capable of variation over a three-order-of-magnitude frequency range, utilizes switching means for simultaneously connecting N resistances, where N is an integer greater than zero, cyclically between a filter input terminal and adjacent ones of (2N+1) nodes, each node being connected to one terminal of an individual one of (2N+1) capacitive filter elements, having the remaining terminals connected to ground potential. The resistances are controllably connected to the input terminal by a commutating switch drive circuit receiving a digital signal having a selected edge transition frequency equal to (2N+1) times the commutating filter selection frequency. The capacitor filter elements are connected through maximum-positive-polarity voltage and maximum-negative-polarity voltage gating means, respectively, to respective maximum and minimum signal busses, respectively connected to the differential inputs of a differential amplifier. The greatest positive-polarity voltage magnitude and the greatest negative-polarity voltage magnitude are respectively connected to the operational amplifier and provide a filter D.C. output voltage which is present substantially only when the filter receives a waveform having the frequency to which the filter has been tuned by the transition frequency of the input digital control signal.

In one presently preferred embodiment, the commutating switch drive circuitry utilizes a divide-by-(2N+1) counter having its outputs connected to the word select inputs of a read-only memory having (2N+1) data words each of (2N+1) output bits each connected for closing N of the input switching means at any chosen time.

Accordingly, it is an object of the present invention to provide a novel capacitive commutating filter for detecting a periodic waveform of a frequency established responsive to a digital control signal.

This and other objects of the present invention will become apparent upon consideration of the following detailed description when read in conjunction with the drawings.

BRIEF DESCRIPTION OF THE DRAWINGS

FIG. 1 is a schematic diagram of a presently preferred embodiment of the capacitive commutating filter in accordance with the invention;

FIG. 1a is a schematic block diagram of a general input portion for the capacitive commutating filter of the present invention; and FIG. 2 is a graph illustrating an input waveform and useful in understanding operation of the capacitive commutating filter of the invention.

DETAILED DESCRIPTION OF THE INVENTION

Referring initially to FIG. 1, one presently preferred embodiment of my novel capacitive commutating filter 10 includes an input terminal 10a, to which an input voltage waveform $V_{in}$, is applied, with respect to a ground potential input terminal 10b. A commutating switch section 11 connects input terminal 10a via N commutating resistors, where N is an integer greater than zero, sequentially to N simultaneous ones of a set of (2N+1) nodes. A different one of (2N+1) capacitors is connected between each of the nodes and ground potential. In the illustrative embodiment N=2, whereby commutating switch section 11 has 2N+1=5 nodes N1-N5, each connected to one terminal of an associated one of capacitors C1-C5, respectively. The remaining terminal of each of the five capacitors is connected to ground potential. Input terminal 10a is individually connectable through (2N+1) switching devices, e.g. field-effect transistor switching devices S1-S5, each in series with one of (2N+1) total commutating resistors, e.g., resistors R1-R5, each connected to an associated one of the nodes, e.g. nodes N1-N5. N (e.g. two) adjacent ones of switches S are closed at any particular instant, with a cyclic change occurring at the mid-point of the conduction of any particular switch. That is, the switches are cyclically closed, e.g. in order S1, S2, S3, S4, S5, S1 and so forth; at the instant that a particular switch, e.g. switch S3, is closed, the second-lower switch, e.g. switch S1, is just opening, and the next-lower switch, e.g. S2 (which was closed halfway through the closed time interval of the second-lower switch S1) is itself halfway through its closed time interval. Similarly, the switch to be next-sequentially-closed, e.g. switch S4, will close halfway through the time interval during which switch S3 is closed, and the second-higher-closing switch, e.g. switch S5, will close when next-higher switch S4 is halfway through a closure period, and at the time when switch S3 itself opens. Thus, there are always two switches closed and input terminal 10a is connected to a pair of adjacent commutating resistors, which, in turn, apply the instantaneous input signal amplitude to a pair of adjacent ones of capacitors C1-C5.

The general form of the input circuit (for N=2) is shown in FIG. 1a, wherein switch S' acts, responsive to the signal at the input S'$_i$ thereof, to connect the pair of input resistors R to N=2 two sequential ones of nodes N1-N5. The commutating signal at input S'$_i$ is provided by commutating switch drive circuitry 12, which is itself activated in response to a digital signal having periodic transitions at a rate equal to $(2N+1)$ times the desired frequency $f_0$ to be acquired. In the illustrative embodiment, with $N=2$ and $(2N+1)=5$ nodes, a train of pulses, or a binary signal having a chosen-polarity transition frequency, of $5 f_0$ is required at input 12a.

Returning to FIG. 1, commutating switch drive circuitry 12 utilizes a divide-by-$(2N+1)$ means 14, e.g. a divide-by-five means when $N=2$. Means 14 may, in the illustrative embodiment, be formed by the divide-by-five counter in a standard 7490 TTL integrated circuit. Thus, responsive to the $5 f_0$ frequency of the positive-going transitions of the digital input signal applied to means input 14a, five different states of the divider means logic outputs B∅, B1 and B2 occur and are coupled to the associated A∅, A1 and A2 inputs of a read-only memory means 15. Memory means 15 is a $(2N+1)$ word by $(2N+1)$ bit memory, e.g. a five-word by five-bit memory means, when $N=2$. Each of the five memory means data outputs D∅-D4 is individually connected to the control electrode of an associated switch means S, in manner such that a logic-one level at a particular memory means output D controls the associated switch means S to the on, or closed, condition. For the particular embodiment shown, the memory means inputs A, memory means outputs D and switch means S closures assume the sequence shown in the following table: T,0070

It will be seen that a complete cycle through the table thus occurs at $1/(2N+1)$ of the commutating switch drive frequency, whereby a full cycle of switching of the input signal to the various nodes and associated capacitors occurs at the desired frequency $f_0$ of the periodic signal to be filtered. The commutated wave is applied to each of the capacitors for the same $N/(2N+1)$ portion of the input frequency waveshape on each cycle of the input signal. Since the values of the input resistances R1-R5 (or R in the general case) are the same, the voltages across each of the capacitors C1-C5 reach equlibrium at different voltages, in a number of desired frequency waveform cycle dependent upon the desired frequency $f_0$, series resistance R and shunt capacitance C.

As illustrated in FIG. 2, the first capacitor C1 is connected to the input at the start of time interval $T_1$, after some delay time d after the positive-going zero crossing of each cycle. Delay time d is totally arbitrary and does not affect operation of the commutating filter 10. It will be seen that first capacitor C1, being connected during time interval $T_1$, receives only positive-polarity portions of the input wave and therefore equilibrates at some positive D.C. voltage. Capacitor C2 is connected to the input during time interval $T_2$ (commencing midway through the first capacitor time interval $T_1$), has both positive-polarity and negative-polarity portions of the input wave applied thereto and equilibrates, in the illustrated example, at a positive polarity voltage lower than the positive polarity equilibrium voltage on capacitor C1. Similarly, capacitor C3, connected to the input during time interval $T_3$ (commencing at the termination of time interval $T_1$, which is the mid-point of time interval $T_2$), receives both positive-polarity and negative-polarity portions of the signal; as the negative-polarity portion is here greater than the positive-polarity portion, a negative-polarity equilibrium voltage appears across capacitor C3. The equilibrium voltage across capacitor C4 is also of negative-polarity, as capacitor C4 is connected to the input during time interval $T_4$ (commencing at the termination of time interval $T_2$ and the mid-point of time interval $T_3$), during which time interval capacitor C4 receives a greater negative-polarity portion of the input wave then a positiveo-polarity portion. Capacitor C5 is connected to the input during time interval $T_5$ (commencing at the termination of time interval $T_3$ and at the mid-point of time interval $T_4$) and receives a positive-polarity input wave portion slightly larger than the negative-polarity input wave portion received, whereby the equilibrium voltage across capacitor C5 is positive. It will be seen that, midway through time interval $T_5$, switch S1 again closes and connects capacitor C1 to the input at the start of the next first capacitor time interval $T_1'$, which time interval commences at the delay time d after the positive-going zero crossing of the next input wave cycle. Illustratively, if the peak magnitude of the input waveform is 1 volt (or 2 volts peak-to-peak) at the filter center frequency $f_0$, and each capacitor is connected to the same two-fifths of the input wave on each cycle of the input signal, the equilibrium, or average, voltages across capacitors C1-C5 will respectively be +0.754 volts, +0.233 volts, −0.610 volts, −0.610 volts and +0.233 volts.

A differential amplifier 17 has the non-inverting +input 17a thereof connected to a maximum bus M through a resistor Ra, and has the inverting −input 17b thereof connected to a minimum bus m through another resistor Ra. A first plurality $(2N+1)$ of diodes each have the cathode thereof connected to maximum bus M, with each anode being connected to a different one of the node-shunt capacitance junctions. Thus, a first diode D1M as its anode connected to node N1 and capacitor C1, while diodes D2M-D5M respectively have individual anodes individually connected to respective associated nodes N2-N5 and respective associated capacitors C2-C5. Another plurality $(2N+1)$ of diodes have their anodes all connected to minimum bus m with each cathode being connected to a different junction of an associated one of the $(2N+1)$ and associated $(2N+1)$ capacitances. Thus, a first diode D1m has the cathode thereof connected to node N1 and capacitive C1, while the cathodes of diodes D2m-D5m are respectively individually connected to the associated one of nodes N2-N5 and the associated one of shunt capacitance C2-C5. The output 17c of differential amplifier 17 is connected through a feedback resistor Ra to input 17b and also to the commutating filter output terminal 10c to provide an output voltage $V_0$ with respect to ground potential output terminal 10d.

When the input frequency is substantially equal to the filter frequency $f_0$ set by the frequency of the digital control signal at control input 12a, that capacitor having the largest positive-polarity equilibrium voltage thereacross will cause the associated one of the maximum diodes to conduct and place that maximum-positive-polarity voltage upon maximum bus M. In the illustrative example, the maximum voltage is across capacitance C1, whereby associated diode D1M conducts and a voltage of +0.754 volts appears at differential amplifier non-inverting input 17a. Similarly, when the input waveform is substantially at the programmed filter waveform frequency $f_0$, that one of the filter capacitances having the greatest magnitude of negative-polarity voltage thereacross causes the associated one of the minimum diodes to conduct to place the greatest magnitude of negative-polarity voltage on minimum bus m. Thus, in the illustrative example, both capacitances C3 and C4 have the same average voltage of −0.610 volts thereon, whereby either of the associated diodes D3m or D4m conduct and the −0.610 volts signal appears at differential amplifier inverting input 17b. The magnitude $V_0$ of tthe output signal at differential amplifier output 17c, and therefore at the filter output terminal 10c, is therefore the difference between the positive-polarity maximum bus M signal and the negative-polarity minimum bus m signal, e.g. (0.754−(−0.610))=1.364 volts for the 1 volt peak input sine wave condition. As the signal on busses M and m are both D.C. levels, the output signal Vo is also a D.C. level.

When the input waveform frequency is much different from the programmed frequency $f_0$, the filter capacitors average across a different portion of the input sine wave during each commutation cycle and the average voltage level across each capacitor falls toward zero magnitude; the resultant output signal Vo therefore tends toward a zero magnitude. Therefore, in operation, only if the signal applied between input terminals 10a and 10b is at, or close to, the programmed frequency $f_0$, will a positive D.C. voltage appear at output terminal 10c, with respect to terminal 10d. It will be seen that the center frequency of filter 10 is easily changed, typically over a three order-of-magnitude (1000:1) range, by changing the frequency of the (2N+1) $f_0$ transitions of the commutating switch drive circuitry input signal, at input terminal 12a.

It will also be seen that the effective bandwidth of the filter and the center-frequency detection time will be dependent upon the particular values chosen for the input resistances R, e.g. resistance elements R1–R5, and for the filter capacity C, e.g. equal capacitances C1–C5; typical bandwidths of 1.8% and tone detection times of 50 milli-seconds, are obtainable, with either sine of squarewave input signals.

It will also be seen that the polarity of the output D.C. level can be reversed by reversing connections of the maximum M and minimum m busses to inputs 17a and 17b.

The entire capacitive commutating filter 10 may be easily integrated into a single semiconductor integrated circuit, if the end use so requires; such integrated circuit would be a low cost implementation requiring no tuning, and utilizable in an extremely broad range of applications.

While one presently preferred embodiment of my novel capacitive commutating filter has been described herein, many modifications and variations will now become apparent to those skilled in the art. It is my intent, therefore, to be limited only by the scope of the appending claims and not by the particular details presented by way of description herein.

What is claimed is:

1. A commutating filter for detecting the presence of a waveform substantially at a selected frequency, comprising:
   input terminal means for receiving the waveform;
   output terminal means;
   a differential amplifier having an inverting input, a non-inverting input and an output connected to said output terminal means;
   a first plurality N, where N is an integer greater than one, of resistance elements each having a first terminal and a second terminal;
   a second plurality 2N+1 of capacitive filter elements;
   means responsive to said selected frequency for simultaneously connecting, in sequential but overlapping and cyclical manner, N adjacent ones of said capacitive filter elements each in series with an associated one of the plurality N of resistance elements to the signal at said input terminal means to cause D.C. equilibrium voltages to appear across each of said capacitive filter elements only when the input terminal waveform has a frequency substantially equal to the selected frequency;
   means for respectively coupling only the greatest positive-polarity and negative-polarity D.C. equilibrium voltages established across different ones of the plurality of capacitive filter elements selected ones of the differential amplifier inputs to cause a D.C. voltage of level proportional to the amplitude of the selected frequency waveform to appear at said output terminal means.

2. The filter of claim 1, wherein said coupling means includes: a plurality 2N+1 of diodes each connected from a different one of the capacitive filter elements to provide the maximum positive-polarity voltage on any one thereof to one of said differential amplifier inputs; and another plurality 2N+1 of diodes each connected from a different one of the capacitive filter elements to provide the maximum or negative-polarity voltage on any one thereof to the remaining one of said differential amplifier inputs.

3. The filter of claim 2, wherein the maximum positive-polarity voltage is connected to the non-inverting input of the differential amplifier and the maximum negative-polarity voltages is connected to the inverting input of the differential amplifier.

4. The filter of claim 3, wherein the output voltage magnitude is equal to the sum of the absolute values of the voltages at the differential amplifier inverting and non-inverting inputs.

5. The filter of claim 1, wherein the number of resistive element is 2N+1 and said connecting means includes: a plurality of 2N+1 of switching devices, each in series with one of said plurality 2N+1 of resistive elements between said input terminal means and a different one of the capacitive filter elements; and means for closing each of the plurality of switch means for N/(2N+1)ths of the time interval corresponding to said selected frequency, with closure of each of said switching devices occurring after completion of one-half of the closed time interval of the immediately previously-closed switching device.

6. The filter claim 5, wherein said closing means is responsive to a digital signal having a characteristic periodically occurring at 2N+1 times the selected frequency.

7. The filter of claim 6, wherein the closing means includes means for dividing the periodically occurring characteristic to provide 2N+1 output states during each cycle of the selective frequency waveform; and means for closing N selected ones of the switching devices each responsive to selected ones of the dividing means output states.

8. The filter of claim 7, wherein N=2.

9. The filter of claim 7, wherein said selective closing means is a read-only memory storing a plurality (2N+1) words each having 2N+1 data bits.

10. The filter of claim 5, wherein said switching means includes a plurality of field-effect transistors.

* * * * *